(12) United States Patent  (10) Patent No.: US 8,228,067 B2
Conti et al.  (45) Date of Patent: Jul. 24, 2012

(54) LOAD BANK

(75) Inventors: Chris Conti, West New York, NJ (US); Marc Palmer, Maplewood, NJ (US); Robin Lee, Hamburg, NJ (US)

(73) Assignee: Production Resource Group, LLC, New Windsor, NY (US)

( * ) Notice: Subject to any disclaimer, the term of this patent is extended or adjusted under 35 U.S.C. 154(b) by 449 days.

(21) Appl. No.: 11/934,012

(22) Filed: Nov. 1, 2007

(65) Prior Publication Data

US 2008/0211508 A1  Sep. 4, 2008

Related U.S. Application Data

(60) Provisional application No. 60/864,133, filed on Nov. 2, 2006.

(51) Int. Cl.
*G01R 31/02* (2006.01)
*G01R 31/327* (2006.01)

(52) U.S. Cl. .................................. 324/415; 324/424
(58) Field of Classification Search ............... 324/415, 324/424
See application file for complete search history.

(56) References Cited

U.S. PATENT DOCUMENTS

| | | | | |
|---|---|---|---|---|
| 3,806,837 | A * | 4/1974 | Carr et al. | 333/1.1 |
| 4,445,047 | A * | 4/1984 | Cannon | 307/31 |
| 5,418,403 | A * | 5/1995 | Morell, III | 307/72 |
| 6,466,424 | B1 * | 10/2002 | Larranaga et al. | 361/103 |
| 6,809,532 | B2 * | 10/2004 | Araki | 324/750 |
| 7,268,558 | B2 * | 9/2007 | Mills et al. | 324/424 |
| 2008/0149834 | A1 * | 6/2008 | Bernhardt et al. | 250/330 |

* cited by examiner

*Primary Examiner* — Amy He
(74) *Attorney, Agent, or Firm* — Law Office of Scott C. Harris, Inc.

(57) ABSTRACT

A load bank that is used to test electrical connections. The connections are attached to the load bank, so that the switches are loaded during the testing. The overheating or underheating, of either switches or loads can be tested, evaluated, and used to determine faults and errors.

20 Claims, 1 Drawing Sheet

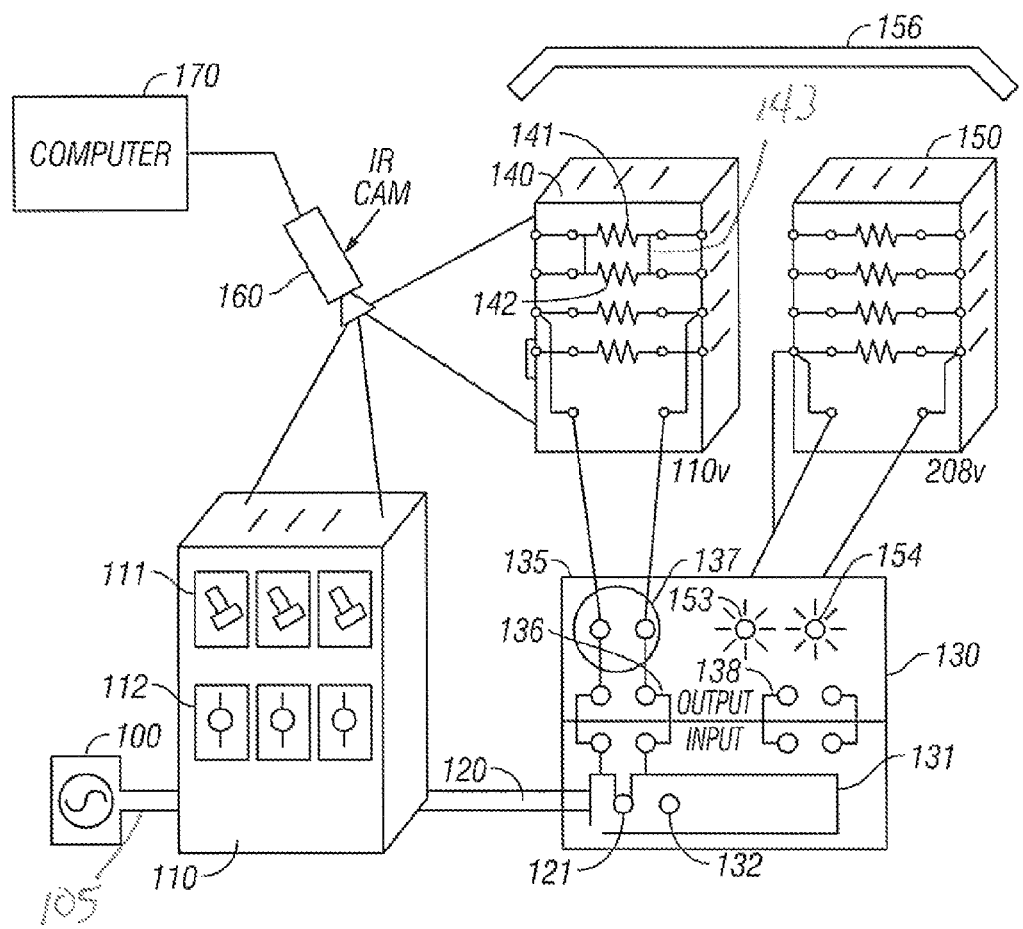

LOAD BANK

This application claims priority from provisional application No. 60/864,133, filed Nov. 2, 2007, the disclosure of which is herewith incorporated by reference.

BACKGROUND

In a commercial stage environment, power must be distributed to loads. The power distribution usually occurs using a power distribution box which may include commercial electronic devices such as circuit breakers, dimmers, and other analogous parts.

In large venues, when it is necessary to produce many different power outputs to many different devices, reliability of that power distribution device may become an issue. The reliability issue is even more important in rental parts, where items are rented and returned, then rented to others.

SUMMARY

The present application describes a load bank and connection system which allows evaluation and testing of power distribution parts.

BRIEF DESCRIPTION OF THE DRAWINGS

FIG. 1 shows an embodiment.

DETAILED DESCRIPTION

The general structure and techniques, and more specific embodiments which can be used to effect different ways of carrying out the more general goals, are described herein.

FIG. 1 shows an embodiment. A commercial source of power 100, for example, a generator or a connection to a high current power source, is connected via a cable 105 to an electronic control box 110. The electronic control box 110 may include a number of electronic devices including breakers such as 111, and dimmers such as 112. The device may also include other electrical control devices. The main function of the control box 110 is intended to be distribution of power to remote loads. In operation, the output cable 120 includes a plurality of seperate output cables that are intended for distribution to a number of different locations. Each output cable may have a specified connector such as 121. A number of different standard format connectors are known, including single circuit type connectors, such as "stage pin" connectors, twist lock connectors, "Edison" connectors, 14_50 connectors, or multi-connectors, such as Socapex connectors, or others.

A distribution box 130 is located to receive the connectors for testing in this embodiment. The distribution box 130 includes a connector panel 131 which may include a number of different connectors, such as 132, of various types. The connectors may be standard connectors, for example, they may include locations for one hundred different connectors. The distribution box 130 also includes an output portion 135. Each of the input connectors can be connected via a splice connector such as 136 to an output connector 137 or 138. Each of those connectors 137, 138 may have one connection pin, or may have multiple such connection pins. The distribution box 130 may also indicator lights, e.g., load status lights that are connected in series with the load or to otherwise detect the load, and which may have individual lights such as 153, 154, that light when loads are connected. The box 130 may also have status indicator lights to show other features.

Each output connector is connected to a specified resistance within a load box. In the embodiment, there are two different load boxes shown as 140 and 150. The load box 140 includes a plurality of resistors such as 141. Each resistor such as 141 is connected individually to a different power output. For example, connection to the connector 137 may connect a plurality of different power sources to the different resistors such as 141, 142, that each one power source output is connected to an individual resistor. The resistors, for example, may be sized with comparable size resistances to form a proper amount of power load, and hence stress, on the breakers or dimmers (e.g. 75% of maximum rated load). For example, the resistors may dissipate 3000 W per resistor for a 30 amp circuit In another embodiment, the resistors may be configurable, so that for example, a connection such as 143 between resistors 141 and 142 can be made to allow two resistors to be connected in series, or two resistors to be connected in parallel.

A separate load box 150 may be configured separately for different voltages, such as 208 volts, or for multiple phase output power.

In the embodiment, the load box may be vented on top and sides. It may be fan cooled or convection cooled. It may be sized to be placed on a roof, or the like.

A top-mounted rain shield 156 is spaced from the top of the load box, and allows the box to dissipate power, but prevents rain from reaching the loads such as 141, which may otherwise be damaged by cool liquid.

The testing of the electrical loads looks for different circuits which are either failing, or not working quite as well. For example, breakers sometimes soften over time, and become resistive. By testing under load, a determination can be made of whether the breaker will withstand the proper electrical loading. If the breaker is defective, it is likely to fail during the test. If the breaker is becoming resistive, it will heat up during the test.

Another aspect uses an infrared camera and/or some other kind of sensor 160, which can be either manually observed, or can be monitored by a computer 170. The infrared camera 160 may view either the power distribution box 110, or at either of the loading boxes. When viewing the power distribution box 110, the infrared camera 160 can look for hotspots, for example. In one embodiment, the breaker box can be operated under load, and a snapshot of the breaker box under load can be taken by the infrared camera. Either the computer 170, or an operator can later look at the breaker box to determine whether any of the breakers are overheating. For example, the computer may automatically look for indications of hot areas within the image. If one breaker is hotter than the others, this can indicate an already-occurring failure, or an imminent failure. Other sensors may include pyrometers, and laser based temperature sensors, which can alternatively be used for this function. As an alternative, the sensing can sense current within the resistor(s) 141, e.g., using an ammeter attached to the loads, or using a remote current sensing such as Hall effect.

An infrared camera or sensor 160 is one example of a fault detection system that automatically detects a fault by term in detecting a heat amount thereof. For example, the dimmer may be flagged as faulty when it overheats, and in essence gets too hot. The load bank may also signal a fault, however, when it underheats, meaning that not enough power or no power at all is being delivered to one of the specified loads By detecting which loads are getting hot, the system can automatically make a determination of the errors in the connection panel 110.

The general structure and techniques, and more specific embodiments which can be used to effect different ways of carrying out the more general goals are described herein. [0014] Although only a few embodiments have been disclosed in detail above, other embodiments are possible and the inventors intend these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, other resistance sizes can be used, and other devices can be tested in this way.

Also, the inventors intend that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The computer may be a Pentium class computer, running Windows XP or Linux, or may be a Macintosh computer. The computer may also be a handheld computer, such as a PDA, cellphone, or laptop.

The programs may be written in C, or Java, Brew or any other programming language. The programs may be resident on a storage medium, e.g., magnetic or optical, e.g. the computer hard drive, a removable disk or media such as a memory stick or 3D media, or other removable medium. The programs may also be run over a network, for example, with a server or other machine sending signals to the local machine, which allows the local machine to carry out the operations described herein.

What is claimed is:

1. A system, comprising:
   a connection part, receiving multiple different power cables, each carrying electrical power, said connection part including an input connector receiving said power cables, and an output connector; and
   a load bank, having a plurality of loads, connected to said output connector, said load bank having at least one load connected to a first of said connection parts, and another load connected to a second of said connection parts, further comprising an electrical switching box, having plural different electrical control parts therein, said plural different control parts including at least multiple different circuit breakers, and said multiple different power cables being connected to said electrical switching box; and
   an infrared camera, obtaining an infrared photo indicative of said at least one circuit breaker while said at least one circuit breaker is being energized by current.

2. A system as in claim 1, wherein said electrical switching box also includes at least one dimmer therein, and at least one power cable also connected to the dimmer, where said at least one power cable is also connected to said input connector.

3. A system as in claim 1, further comprising an electrical connection making part, on said connection part, said electrical connection making part allowing connecting between said input connector and said output connector, and said electrical connection making part having a first switching configuration where a first input connector is connected to a first output connector, and having a second configuration in which said first input connector is connected to said second output connector.

4. A system as in claim 1, further comprising a computer that automatically analyzes said infrared photo to determine if any of said circuit breakers are overheated.

5. A system as in claim 1, further comprising a computer that automatically analyzes said infrared photo to determine spots which are underheated.

6. A system as in claim 1, further comprising a plurality of cooling vents on said load bank.

7. A system as in claim 6, further comprising a rain shield, covering the top of said load bank while still venting the plurality of loads to dissipate power.

8. A method, comprising:
   connecting an input power to a switch bank, which includes a plurality of electrical switches therein, each of which switches connect between said input power, and a separate circuit on an output power;
   connecting at least a plurality of said separate circuits on the output power to a load bank which includes a plurality of loads therein; and
   testing said switches by applying said input power to said switches via said loads, wherein said testing comprises using an infrared camera to carry out said testing while said switches and said loads are energized by current and obtaining infra red pictures of said switches to determine switches which are faulty based on said infrared pictures.

9. A method as in claim 8, wherein said switch bank also includes a plurality of dimmers therein, and said testing also includes testing said dimmers.

10. A method as in claim 8, wherein said connecting comprises connecting the circuits to an input portion on a switching unit, and connecting the load bank to an output portion of the switching unit, and allowing changing a connection between said input portion and said output portion.

11. A method as in claim 8, wherein said testing comprises determining overheating in any of a plurality of circuit breakers.

12. A method as in claim 8, further comprising a rain shield, covering the top of said load bank while still venting the plurality of loads, using openings, to dissipate power and at least one rain cover, covering said openings.

13. A method, comprising:
   connecting an input power to a switch bank, which includes a plurality of electrical switches therein, each of which switches connect between said input power, and a separate circuit on an output power;
   connecting at least a plurality of said separate circuits on the output power to a load bank which includes a plurality of loads therein; and
   testing said switches by applying said input power to said switches via said loads, wherein said testing comprises determining underheating in one of said switch bank or said load bank.

14. A system, comprising:
   a connection to an electrical control center, said connection including a plurality of separate lines, said separate lines collectively forming separate circuits which are separately switched by switches in said electrical control center;
   a load bank including a plurality of loads, including at least one load for each of said separate circuits, said load bank also including a reconnection structure which enables reconnecting said loads into different connections with one another; and
   a fault determination device, which automatically determines at least one fault in the system by detecting a heat amount of at least one of said switches, said fault determination device includes an infrared camera that obtains an infrared image of said switches while said load bank is connected and energized.

15. A system as in claim 14, further comprising a connection device, having at least one connector that receives said connection including said plurality of separate lines, and said connection device also connected to said load bank, and said connection device includes an ability to connect between any of multiple inputs and any of multiple outputs.

16. A system as in claim 14, wherein said load bank includes a connection part, that allows connecting multiple loads in series with one another in a first connection, and allows connecting said multiple loads in parallel with one another in a second connection.

17. A system as in claim 16, further comprising a processing computer, connected to said infrared camera and receiving information therefrom, and said fault determination device is responsive to said infrared camera.

18. A system as in claim 14, further comprising a plurality of holes in a top portion of said load bank, and at least one rain cover, covering said holes.

19. A method, comprising:
    connecting multiple different power cables, each of which is separately switched;
    connecting said power cables to a load bank, having a plurality of loads, connected to an output connector, said load bank having at least one load connected to a first of said power cables, and another load connected to a second of said power cables; and
    using a computer and an infrared camera for testing for errors by finding areas that are heated less than expected.

20. A method as in claim 19, wherein said power cables are switched by circuit breakers, and wherein said using comprises finding areas of said circuit breakers that are heated less than expected.

* * * * *